United States Patent [19]
Taniguchi et al.

[11] Patent Number: 5,981,948
[45] Date of Patent: Nov. 9, 1999

[54] TRANSMISSION ELECTRON MICROSCOPE AND METHOD OF OBSERVING ELEMENT DISTRIBUTION

[75] Inventors: Yoshifumi Taniguchi; Shigeto Isakozawa, both of Hitachinaka, Japan

[73] Assignee: Hitachi, Ltd., Tokyo, Japan

[21] Appl. No.: 09/030,477

[22] Filed: Feb. 25, 1998

[30] Foreign Application Priority Data

Mar. 3, 1997 [JP] Japan .................................... 9-048202

[51] Int. Cl.$^6$ .................................................. H01J 37/153
[52] U.S. Cl. ............................................ 250/311; 250/305
[58] Field of Search .................................. 250/311, 305, 250/306, 307

[56] References Cited

U.S. PATENT DOCUMENTS 5,578,823  11/1996  Taniguchi ................................ 250/311

FOREIGN PATENT DOCUMENTS 8222169  8/1996  Japan .

OTHER PUBLICATIONS

The Electron Microscope Society of Japan, the 50th Scientific Conference Proceeding (1994), p. 76.

*Primary Examiner*—Kiet T. Nguyen
*Attorney, Agent, or Firm*—Kenyon & Kenyon

[57] ABSTRACT

Letting core-loss energy of an objective element be $E_c$, and width of the energy selection slit be $\Delta E$. Initially, a pre-edge image obtained by increasing an acceleration voltage of an electron gun by $E_c - \Delta E$ and a pre-pre-edge image obtained by increasing an acceleration voltage by $E_c - \Delta E$ are taken with the same exposure time, and an intensity ratio R of the pre-edge image to the pre-pre-edge image is calculated. Next, a post-edge image obtained by increasing an acceleration voltage by $E_c$ is taken with an exposure time $t_{pre}$, and a pre-edge image is taken with an exposure time $R \times t_{pre}$. An element distribution image of the objective element can be obtained by simply performing image subtraction of the pre-edge image from the post-edge image in a computer.

8 Claims, 6 Drawing Sheets

FIG. 2 *PRIOR ART*

IMAGE OF ELEMENT DISTRIBUTION

IMAGE OF ELEMENT DISTRIBUTION

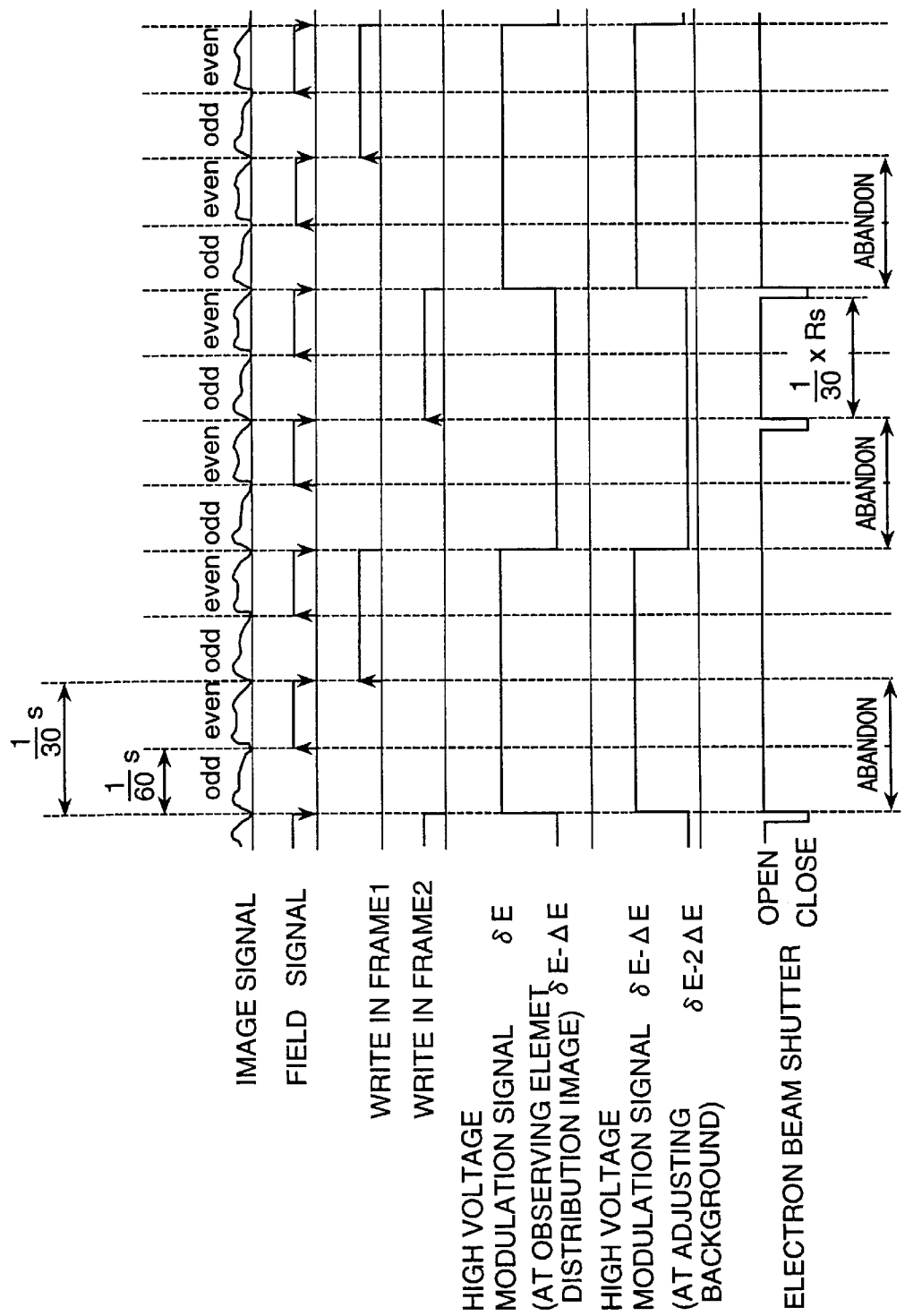

TRANSMISSION ELECTRON MICROSCOPE AND METHOD OF OBSERVING ELEMENT DISTRIBUTION

BACKGROUND OF THE INVENTION

The present invention relates to a transmission electron microscope, and more particularly to a transmission electron microscope which has an energy filter capable of obtaining an element distribution image in a small region by forming an image by separating electrons having a specified energy from an electron beam transmitted a sample, and a method of observing element distribution using the transmission electron microscope.

A transmission electron microscope is an apparatus for magnifying and observing an image of a sample using an electron beam and electron lenses, and used for identifying a fine structure of the sample. An energy filter is an apparatus for extracting only electrons having a specified energy by separating the electron beam into a spectrum. By combining the both, electrons having a specified energy can be obtained.

In an electron microscope having an energy filter completed adjustment of the optical axis, an electron microscope image formed only by elastic scattered electrons (zero-loss image) can be obtained by inserting an energy selection slit on the optical axis. When observation is performed by increasing an acceleration voltage of the incident electron beam by $\delta E$, electrons lost energy by $\delta E$ in a sample pass through the energy filter and then pass through the energy selection slit. Therefore, an energy filter image obtained by the electrons lost energy by $\delta E$ can be obtained by increasing their energy by $\delta E$ when the zero-loss image is formed.

The electrons transmitted through the sample are lost energy by non-elastic scattering such as plasmon loss core loss, and have energy spectrums. Among the losses, the core loss energy is a value inherent to element composing the sample, and a transmission electron microscope image obtained by electrons affected by a specified energy loss shows two-dimensional distribution corresponding to the element composing the sample. However, energy loss by the non-elastic scattering is broadened over a wide range, and information of the other elements is overlapped on it as a background. A true image cannot be obtained until the background is separated and removed. As the methods of obtaining a specified element distribution image by separating and removing the background, there are proposed the following three kinds of methods.

As shown in FIG. 2, the first method is a method which uses two images, that is, the method uses an energy filter image (post-edge image) B obtained by providing an energy window in a region including core loss energy, and an energy filter image (pre-edge image) A obtained by providing an energy window just before the core loss energy so as to prevent core loss electrons from entering. Initially, these two images A, B are input to a computer using a camera apparatus such as a TV camera. Then, by regarding the pre-edge image A as a background of the post-edge image B, and image subtracting is performed by subtracting the pre-edge image A from the post-edge image B in the computer, and thus a two-dimensional distribution image of a specified element is obtained by separating and removing the background.

As shown in FIG. 3, the second method is a method which uses three images, that is, in addition to the two energy filter images B and C+D used in the first method, the method uses an energy filter image (pre-pre-edge image) A obtained by an energy window in a region not including core loss electrons and an energy region different from in the first method. Similar to the first method, initially, these three images A, B. C+D are input to a computer using a camera apparatus such as a TV camera. Change in a background intensity to energy change is obtained for all pixels from the pre-edge image B and the pre-pre-edge image A using the computer, and an accurate background intensity C of the post-edge image (C+D) is calculated for all pixels over the image. By subtracting the background intensity C obtained in such a manner, a two-dimensional distribution image D of a specified element is obtained by separating and removing the background.

As shown in FIG. 4, the third method is a method which uses two energy filter images as the same as the first method, that is, the method uses a post-edge image B and a pre-edge image A. It can be assumed that in a region where the specified element does not exist, the image intensity decreases at a constant rate as the core loss energy varies. However, in a region where the specified element exists, the ratio of image intensities of the post-edge image and the pre-edge image increases by an amount existing the core loss electrons. Therefore, a two-dimensional distribution image of a specified element is obtained by calculating the ratio of image intensities in each pixel to all pixels over the image and display the calculated ratio of image intensities as a two-dimensional image.

In the first method described above, there is difference between the background intensity used for calculation and the actual background. Therefore, although the calculation process is simple, there is a problem in that the method lacks in quantitative validity.

On the other hand, in the second method, although the actual background can be accurately obtained by using two images, the processing time becomes long because three images are necessary and calculation is performed for all pixels over the images. It is reported that the calculation requires approximately one minutes at minimum (Hiroji Kimoto, Tatsumi Hirano, Katsuhisa Usami, Shigeto Isakozawa, Toshimutsu Taya: The Electron Microscope Society of Japan, the 50th Scientific Conference Proceeding (1994) 76). Since the series of processes takes a long time, the processed results cannot be fed back during testing.

The third method has an advantage in that it is simple because only two images are required as the same as in the first method, and the processed result cannot be affected by special contrast such as diffract contrast, and artifact due to erroneous processing of background does not exist. However, there is a problem in that it is possible to perform only qualitative evaluation because of lack of quantitative validity.

Although the first method and the third method are short in calculation time compared to the second method, they are difficult to be applied to a sample in which the element distribution is continuously varying with time or a sample which is gradually deforming. When the sample is drifting, calculation such as operation of additionally performing positioning is required. Further, it is disadvantageous from the viewpoint of cost to introduce a high performance computer.

Position and width of the energy window are important factors for image quality of a final image and evaluation of quantitative validity of an element distribution image, and are required to be set to the optimum condition during testing. When real-time processing is impossible, such optimum condition setting cannot help depending on experience of an operator and is technical difficulty. Further, there is a problem in that an error occurs between pixels during calculating background due to noise contained in an image to reduce the S/N ratio.

A method of rapidly displaying an image obtained from the above-mentioned method is proposed in Japanese Patent Application Laid-Open No.8-222169. In this method, a post-edge image and a pre-edge image are alternatively obtained in synchronism with an image recording signal of a camera means such as a TV camera or a SSCCD (slow scan CCD) camera. These images are periodically stored in two frame memory. Image calculation is performed to the two frame memory every pixel, but the calculation result is directly output as a new image signal. The first method or the third method can be realized depending on selecting subtracting process or dividing process in calculation process, and the second method can be realized by multiplying the image intensity by a predetermined constant and performing subtracting process. By these method, a two-dimensional distribution of a specified element can be observed in real-time since the processes can be periodically and continuously performed.

The technology in regard to the element distribution rapid display is one of the methods to solve the aforementioned problems, but it is necessary to provide a means for varying an image intensity at a constant ratio. Further, the image processing is also performed on read-out noise that must have a common average intensity to all images, which becomes a cause to generate artifact. The read-out noise is of a constant noise level not depending on brightness of an image nor exposure time at taking the image. Therefore, there remains noise level which must be eliminated when the inter-image calculation, particularly when inter-image subtraction is performed.

SUMMARY OF THE INVENTION

An object of the present invention is to solve the above-mentioned problems and to provide a method and an apparatus for observing a distribution image of a specified element using a transmission electron microscope having an energy filter.

In the present invention, the above-mentioned object can be attained by providing the following means.

(1) Exposure time is changed when a post-edge image is taken and when a pre-edge image is taken. The exposure time is determined so that an intensity of the pre-edge image and an intensity of the background image of the post-edge image becomes in the same level. By doing so, the pre-edge image becomes the background image of the post-edge image, and accordingly a quantitative element distribution image can be obtained only by performing inter-image subtraction. Further, since the background calculation based on the above-mentioned second method is already completed at the step of obtaining the images, difference of the read-out noises between the images is eliminated.

(2) The post-edge image and the pre-edge image are repeated to be taken while exposure time is being periodically changed, and intensity obtained by subtracting the pre-edge image from the post-edge image is output as an image signal. By doing so, the element distribution images can be obtained as time passes, element distribution can be observed even if the element distribution is continuously changed or drifted with time. Since position and width of the energy window as well as position of a sample can be set while the element distribution image is being observed as time passes, the position and the width of the energy window can be easily set in the optimum condition. Therein, either in a case of outputting the obtained image signals one-by-one and in a case of outputting the images every a certain interval, the above-mentioned operation can be obtained.

That is, the element distribution observing method in accordance with the present invention is characterized by that in an element distribution observing method for obtaining an element distribution image of a specified element by performing inter-image subtraction between an image of an energy region including core-loss electrons and an image of an energy region not including the core-loss electrons taken by a transmission electron microscope having an energy filter, an exposure time for the image of the energy region not including the core-loss electrons is set to a value shorter than an exposure time for the image of the energy region including the core-loss electrons.

A ratio of the exposure time for the image of the energy region not including the core-loss electrons to the exposure time for the image of the energy region including the core-loss electrons is approximately equal to the reciprocal of an intensity ratio of an intensity of the image of the energy region not including the core-loss electrons to an intensity of the image of the energy region including the core-loss electrons.

Otherwise, the exposure time for the image of the energy region including the core-loss electrons is approximately equal to a value of multiplying the exposure time for the image of the energy region not including the core-loss electrons by a ratio of the intensity of the image of the energy region not including the core-loss electrons to an intensity of an image of an energy loss region lower than the energy region not including the core-loss electrons.

Further, the present invention is characterized by a transmission electron microscope comprising an electron gun; an irradiation electron optical system for irradiating an electron beam emitted from the electron gun; an image forming optical system for image-forming the electron beam transmitted through a sample; an energy filter for separating the electron beam after being transmitted through the sample into an energy spectrum; a means for selecting an electron beam having a specified energy among the energy spectrum of the electron beam; a camera means for picture-taking an image by the energy-selected electron beam; and an exposure control means for controlling exposure time of the camera means, wherein the exposure means sets an exposure time for an image of an energy region not including core-loss electrons to a value shorter than an exposure time for an image of an energy region including the core-loss electrons.

Furthermore, the present invention is characterized by a transmission electron microscope comprising an electron gun; an irradiation electron optical system for irradiating an electron beam emitted from the electron gun; an image forming optical system for image-forming the electron beam transmitted through a sample; an energy filter for separating the electron beam after being transmitted through the sample into an energy spectrum; a means for selecting an electron beam having a specified energy among the energy spectrum of the electron beam, a camera means for picture-taking an image by the energy-selected electron beam; and an exposure control means for controlling exposure time of the camera means, which further comprises a plurality of memory areas for storing energy selected images taken by the camera means; a memory area selecting means for periodically selecting the plurality of memory areas and storing images taken by the camera means into the selected memory areas; an acceleration voltage changing means for changing an acceleration voltage of the electron beam in synchronism with selection of memory areas by the memory area selecting means; an exposure time changing means for changing an exposure time of the camera means in synchronism with selection of memory areas by the memory area selecting means; and an output means for comparatively calculating the images stored in the plurality of memory areas by every corresponding pixel and outputting the differences of image intensities as an image signal.

The images stored in the plurality of memory areas are images of an energy region not including core-loss electrons and images of an energy region including the core-loss electrons; and the exposure time changing means sets a ratio of the exposure time for the image of the energy region not including the core-loss electrons to the exposure time for the image of the energy region including the core-loss electrons approximately equal to the reciprocal of an intensity ratio of an intensity of the image of the energy region not including the core-loss electrons to an intensity of the image of the energy region including the core-loss electrons.

Further, the images stored in the plurality of memory areas are images of an energy region not including core-loss electrons and images of an energy region including the core-loss electrons; and the exposure time changing means sets the exposure time for the image of the energy region including the core-loss electrons approximately equal to a value of multiplying the exposure time for the image of the energy region not including the core-loss electrons by a ratio of the intensity of the image of the energy region not including the core-loss electrons to an intensity of an image of an energy loss region lower than the energy region not including the core-loss electrons.

By using the transmission electron microscope in accordance with the present invention, a two-dimensional distribution of a specified element without background can be obtained.

BRIEF DESCRIPTION OF THE DRAWINGS

FIG. 6 is a time chart showing the process flow of the real-time observation.

DESCRIPTION OF THE PREFERRED EMBODIMENTS

Embodiments of the present invention will be described in detail below, referring to the accompanying drawings.

Figure 1:
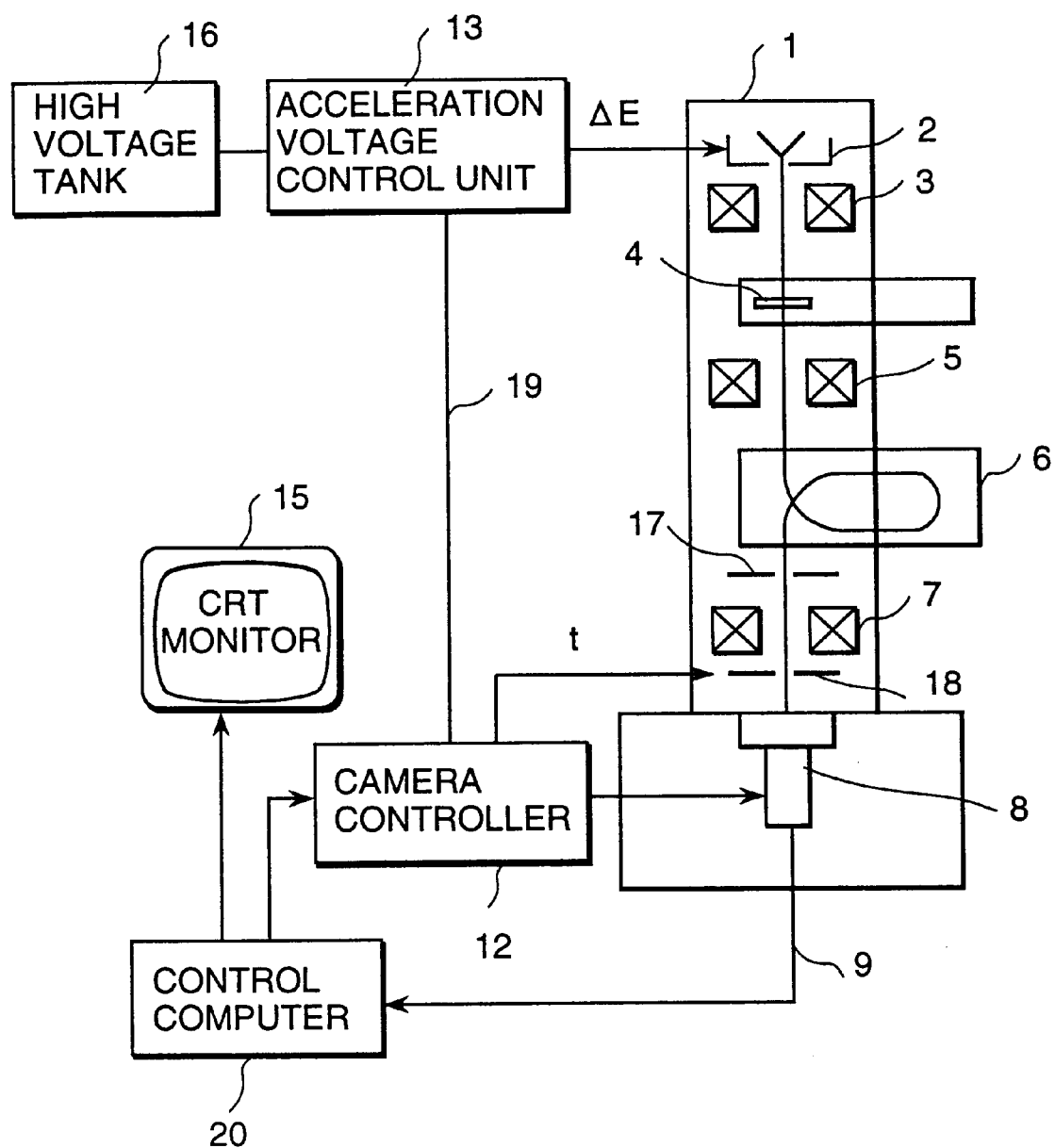
FIG. 1 is a block diagram of a transmission electron microscope in accordance with the present invention.
Figure 2:
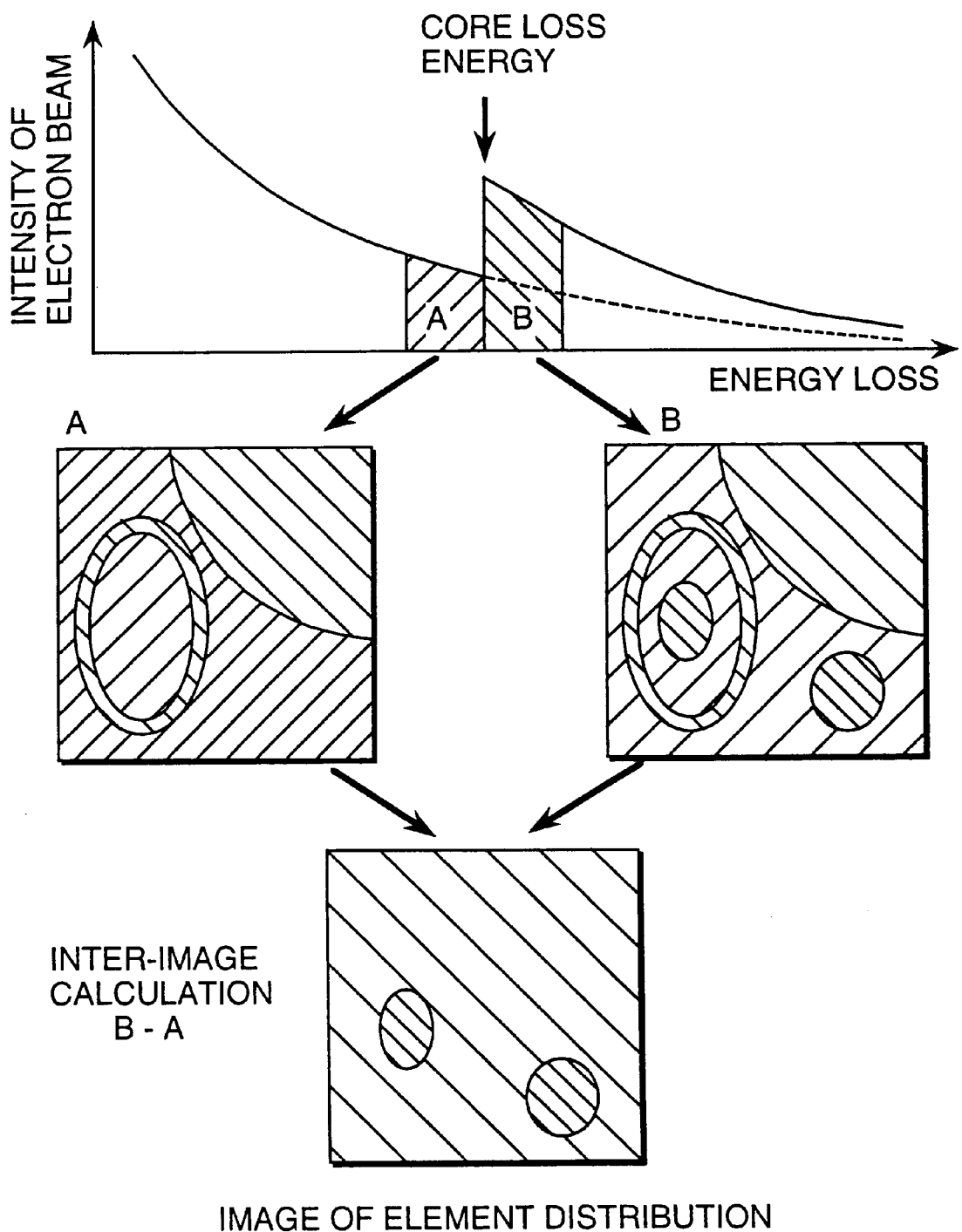
FIG. 2 is a view explaining an element distribution image calculating method for a specified element in accordance with a first method.

FIG. 1 is a block diagram showing an embodiment of a transmission electron microscope in accordance with the present invention. The reference character 1 indicates the transmission electron microscope having an energy filter. An electron beam emitted from an electron gun 2 is accelerated by a high voltage generated by a high voltage tank 16 and irradiated onto a sample 4 by an irradiation electron optical system 3. Most of the electron beam transmits through the sample 4 without loss of energy, but electron beam lost energy corresponding to an element composing the sample by non-elastic scattering is separated by an energy filter 6 after passing through an image forming optical system 5 to form an energy spectrum on an energy selection slit 17. By adjusting the transmission electron microscope 1 so that only zero-loss electrons can be passed through the energy selection slit 17, a zero-loss image image-formed by a final image forming system 7 can be observed by a camera apparatus 8 such as a TV camera.

Next, when the acceleration voltage is increased by $\delta E$ using an acceleration voltage control unit 13, electrons lost energy by $\delta E$ in the sample 4 pass through the energy selection slit 17 after being performed energy separation by the energy filter 6. Therefore, an energy filter image obtained by the electrons lost energy by $\delta E$ can be observed in the camera unit 8.

A camera controller 12 can control exposure time t of the camera apparatus 8. Control of exposure time t may be performed by using an electron beam shutter 18 or by directly controlling accumulating time of the camera. A picture signal 9 obtained by the camera apparatus 8 is stored in a memory of a control computer 20. The control computer 20 transmits a frame signal 19 to an acceleration voltage control unit 13 through the camera controller 12 to set a loss energy. A post-edge image containing core-loss electrons of an element to be obtained and a pre-edge image just before core-loss energy are taken, and image calculation is performed by the control computer 20, and an element distribution image is displayed in a CRT monitor 15.

Display of the element distribution image to be obtained is performed in accordance with the following steps. Letting core-loss energy of an objective element be $E_c$, and width of the energy selection slit be $\Delta E$, a post-edge image including core-loss electrons can be obtained by increasing the acceleration voltage by $E_c$. Similarly, a pre-edge image can be obtained by increasing the acceleration voltage by $E_c - \Delta E$, and a pre-pre-edge image can be obtained by increasing the acceleration voltage by $E_c - 2\Delta E$.

Initially, a pre-edge image and a pre-pre-edge image are taken with the same exposure time, and an intensity ratio R of the pre-edge image to the pre-pre-edge image is calculated. Since the pre-pre-edge image is generally brighter than the pre-edge image, R <1. Next, a post-edge image is taken with an exposure time $t_{pre}$, and a pre-edge image is taken with an exposure time $R \times t_{pre}$. An intensity of the pre-edge image obtained in such a manner becomes equal to an intensity of the background included in the post-edge image. Therefore, an element distribution image of the objective element can be obtained by simply performing image subtraction of the pre-edge image from the post-edge image.

This method can be also applied to a method of rapidly obtaining an element distribution image. In the above-mentioned method disclosed in Japanese Patent Application Laid-Open No.8-222169, an image intensity of the pre-edge image is attenuated using an electric circuit. However, since the same effect can be obtained by control of the exposure time in the present invention, the method of the present invention can be easily applied to real-time observation.

Figure 5:
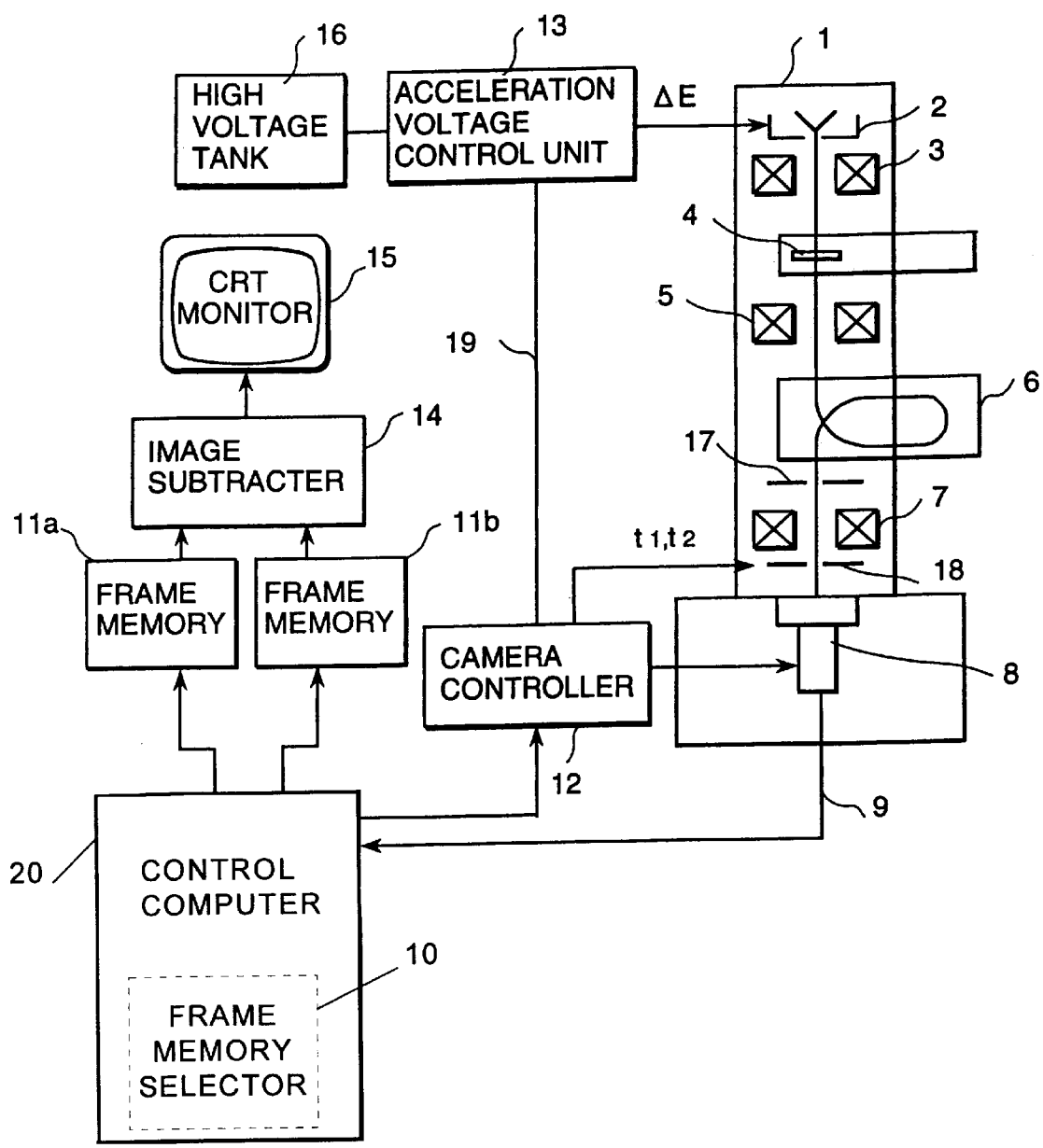
FIG. 5 is a block diagram if a transmission electron microscope foe performing real-time observation.

FIG. 5 is a block diagram showing the real-time observing method of this type. In FIG. 5, the same function parts as in FIG. 1 are indicated by the same reference characters in FIG.

1, and the detailed explanation will be omitted here. Using a synchronizing signal contained in a control signal from the camera apparatus 8 or a synchronizing signal contained in a picture signal 9 from the camera apparatus 8, images on a frame-by-frame base can be separated by a frame memory selector 10. The separated energy filter images on a frame-by-frame base are sequentially stored a plurality of frame memories 11a, 11b. Although two frame memories are shown in FIG. 5, three or more frame memories may be provided. The frame memory selector 10 periodically selects one frame from the frame memories 11a, 11b having plural frames using the above-mentioned synchronizing signal to store an energy filter image.

Further, the frame memory selector 10 also controls the exposure time control unit 12 and the acceleration voltage control unit 13, and increases the acceleration voltage by $\delta E_1$ and sets the exposure time to $t_1$ when the frame memory 11a is selected. The frame memory selector 10 increases the acceleration voltage by $\delta E_2$ and sets the exposure time to $t_2$ when the frame memory 11b is selected. Therefore, filter images lost energy of $\delta E_1$ are input to the frame memory 11a, and filter images lost energy of $\delta E_2$ are input to the frame memory 11b. Since the image intensity is proportional to the exposure time, the intensity ratio of the both images can be set to an arbitrary value by appropriately setting the exposure times $t_1$ and $t_2$. High speed control of the acceleration voltage and high speed control of the exposure time can be performed by using a well-known control means. The control of exposure time may be performed by varying a shutter speed of the electron beam shutter 18 of the transmission electron microscope 1, or may be performed by varying an image accumulation time of the camera apparatus 8. The image subtracter 14 continuously outputs a calculated result of subtracting an image of the frame memory 11b from an image of the frame memory 11a to the monitor 15.

Procedure of observing a distribution of a sample composition element having a core-loss energy of $\delta E$ will be explained below, referring to FIG. 5 and a time chart shown in FIG. 6. Here, it is assumed that a TV camera of NTSC type is used as the camera apparatus, and the image accumulation time is controlled by adjusting opening time of the electron beam shutter 18.

(1) The exposure time control unit 12 periodically sets the image accumulation times $t_1$ and $t_2$ of the camera apparatus 8 by controlling the electron beam shutter 18. The frame memory selector 10 separates image signals 9 continuously output from the camera apparatus 8 in each frame, and generates a signal which becomes in high level at even field (even). This signal is called as a field signal.

(2) The width of the energy window selected by the energy selection slit 17 is set to $\Delta E$. In this step, electron beam from energy losses of 0 (zero) to $\Delta E$ is passes through the energy selection slit 17, and a zero-loss image can be observed.

(3) The acceleration voltage is modulated in synchronism with falling of the field signal. The modulated voltages are $\delta E - \Delta E$ and $\delta E - 2\Delta E$. These acceleration voltage modulations are selections of the energy windows equivalent to B (pre-edge image) and A (pre-pre-edge image) shown in the element distribution observing method of the second method. However, since there is an accumulation time lag between the images, the modulation is performed ever two frames.

(4) The blocks of image data of the image signals 9 are alternatively distributed to the first frame memory 11a and the second frame memory 11b using the frame memory selector 10. A frame just after applying modulation to the acceleration voltage is abandoned, and an image data of the following second frame is input to each of the memories. Energy loss images of from $\delta E - \Delta E$ to $\delta E$ (pre-edge images) are input to the first frame memory 11a, and energy loss images of from $\delta E - 2\Delta E$ to $\delta E - \Delta E$ (pre-pre-edge images) are input to the second frame memory 11b.

(5) Since there is an intensity difference between the pre-edge image and the pre-pre-edge image, in the subtracted image (B−A) output from the image subtracter 14 there remains contrast corresponding to the intensity difference between them. The exposure time control unit 12 controls opening time of the electron beam shutter 18 and determines the image accumulation times $t_1$ and $t_2$ so as to eliminate the contrast. Timings of opening and closing of the electron beam shutter 18 is performed as shown in FIG. 6. By the operation, the intensity of the pre-pre-edge image is attenuated corresponding to a ratio R of one frame rate (1/30 second) to an open time of the electron beam shutter, and change of the background due to energy difference can be corrected. The value of the ratio R can be arbitrarily set from 0 (zero) to 1 (one). When R=1, the intensity of the pre-pre-edge image is not attenuated.

Figure 3:
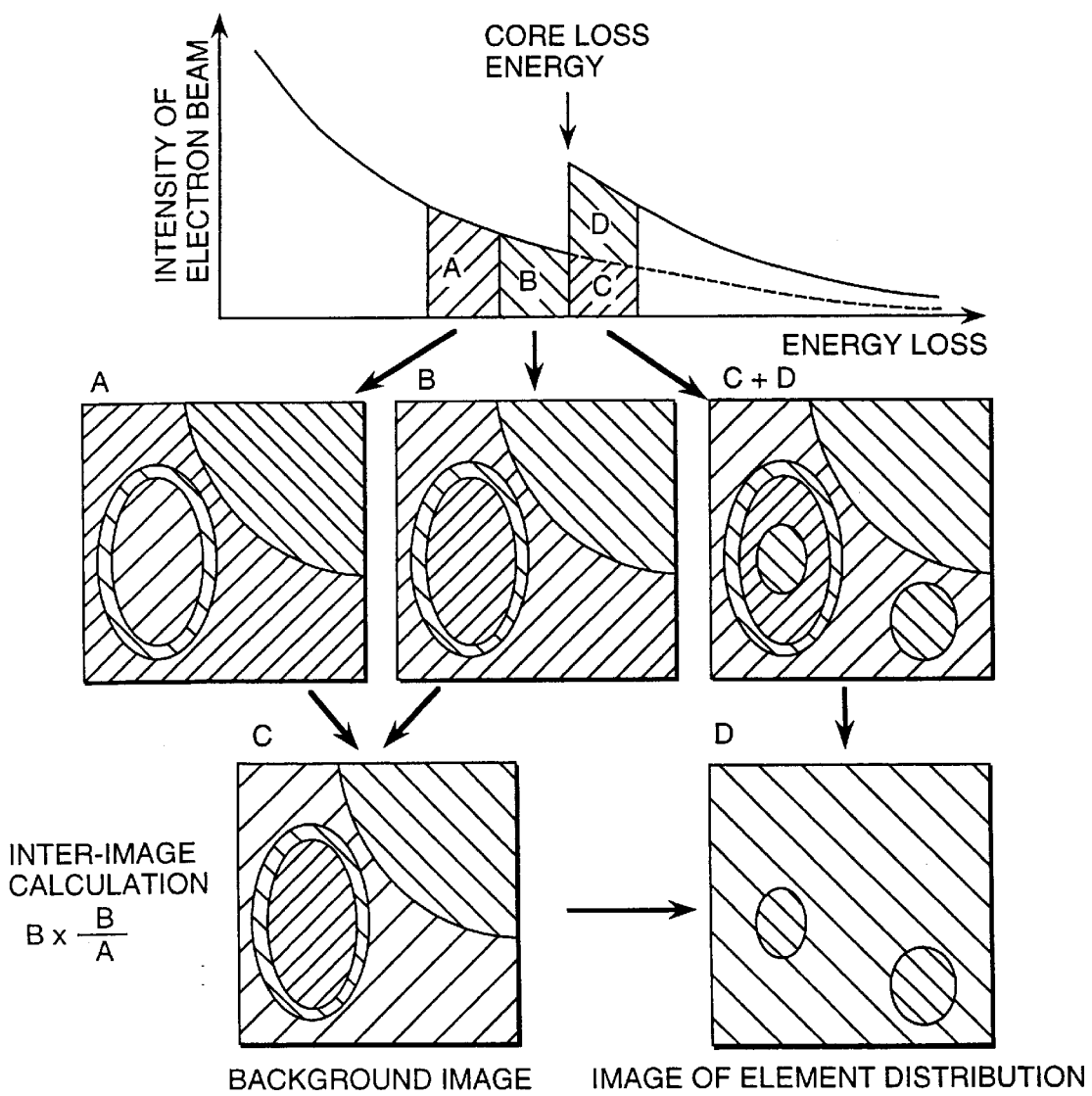
FIG. 3 is a view explaining an element distribution image calculating method for a specified element in accordance with a second method.
Figure 4:
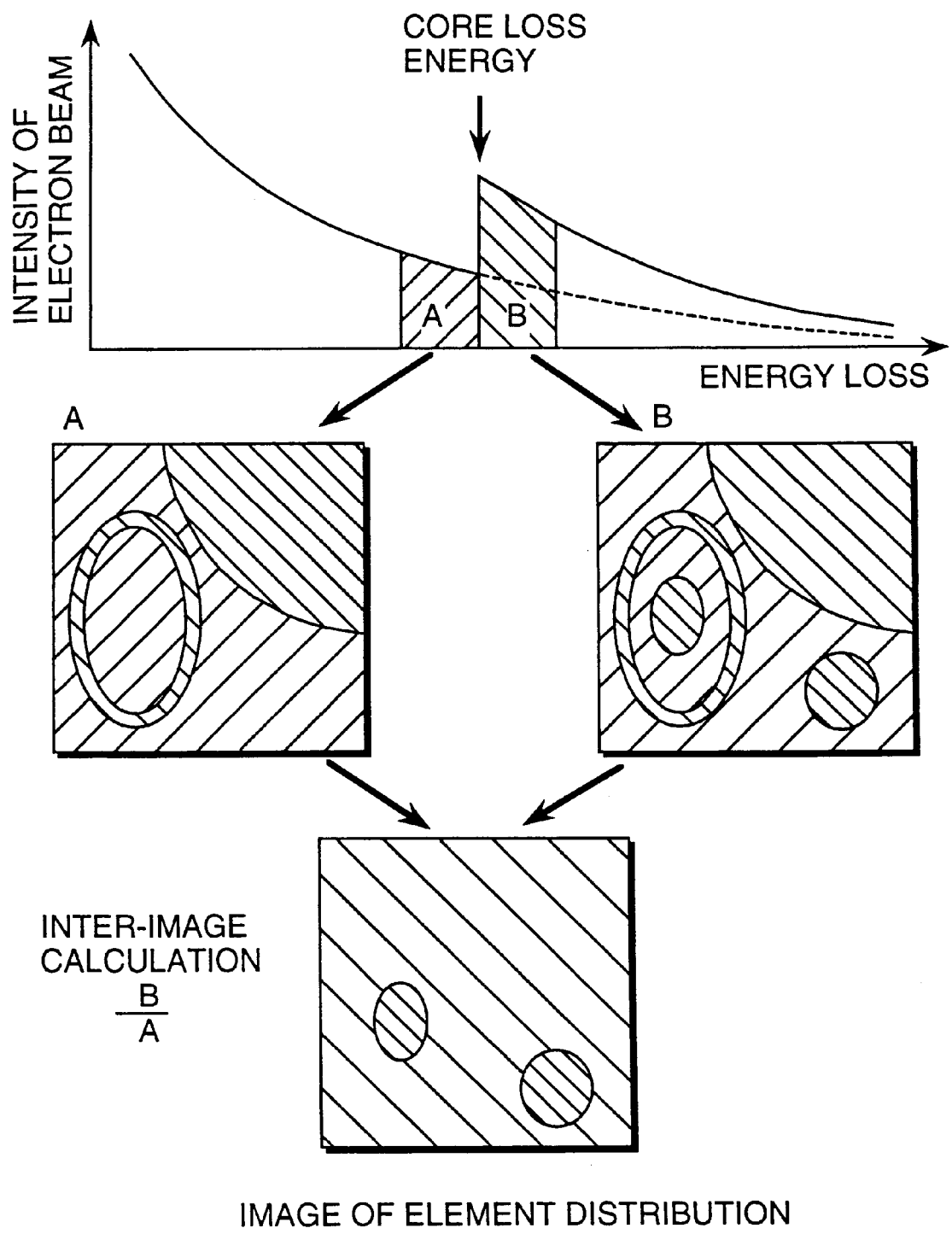
FIG. 4 is a view explaining an element distribution image calculating method for a specified element in accordance with a third method.

(6) After the image accumulation times $t_1$ and $t_2$ are determined in such a manner, the acceleration voltage of the electron microscope is increases by $\Delta E$ as a whole. Then, energy loss images of from $\delta E$ to $\delta E + \Delta E$ (post-edge images) are input to the frame memory 11a, and energy loss images of from $\delta E - \Delta E$ to $\delta E$ (pre-edge images) are input to the frame memory 11b. The post-edge image corresponds to (C+D) of FIG. 3. Since adjustment of exposure time by the electron beam shutter 18 is completed, the loss image B attenuated the image intensity becomes an image equivalent to the accurate background C of the loss image (C+D). Therefore, a subtracted image (C+D−B) output from the image subtracter 14 is the two-dimensional distribution image D of the objective element by the second method described above.

Since images are input to the frame memories 11a and 11b every 2 (two) frame rates (2/30 seconds), the subtracted images are output on the monitor 15 every 2/30 seconds and the two-dimensional distribution of the objective element can be observed in real time. Therefore, this observing method can be applied to observation of a sample in which the element distribution is continuously varying with time or a sample which is gradually deforming. Even if the sample is drifting, there is no need to additionally operate positioning in process.

A slow scan CCD camera has more pixels than common TV camera, and has a wide dynamic range. In a case of choosing a slow scan CCD camera as the camera apparatus 8, it is effective for electron microscope observation and digital image processing. The exposure time to the camera element can be freely select from a fraction of a second to several seconds. When the slow scan CCD camera is employed in the present invention, real-time observation as in a case of employing a common TV camera cannot performed, but processing is completed within several seconds at maximum. By employing both of the common TV camera and the slow scan camera, it is possible to perform adjustment, sample finding and optimum condition setting by the common TV camera and acquisition of data for storing by the slow scan camera.

In a case of using a CCD as the camera apparatus 8, the effect of the present invention does not depend on the type of the CCD. That is, the same effect can be obtained either in a case of an inter-line type CCD or in a case of a frame transfer type CCD. The same can be said when an imaging plate or a high sensitive photo-film is used as the camera apparatus. The imaging plate is suitable for image processing because digital data is directly obtained by taking image using the imaging plate. In a case where images are taken by using photo-films, the data can be used for image processing by being digitized using a scanner.

Further, two frame memories 11a, 11b are used in the embodiment of FIG. 5. However, it is no need to use two frame memories, but the present invention can be performed by using one memory. In that case, one of two images to be compared is input to the image subtracter 14 through the frame memory, and the other image is directly input from the camera apparatus 8 to the image subtracter 14.

The energy filter 6 shown in this embodiment is of an in-column type, and is placed inside the column of the transmission electron microscope 1. However, the present invention can be applied to a case of using a post-column type energy filter which is placed in a place downstream side of the final image plane of the transmission electron microscope.

As having been described above, according to the present invention, the following effects can be attained.

(1) In the past, an element distribution image has been obtained by taking three images, but a quantitative element distribution image can be obtained by only performing inter-image subtraction of two images.

(2) Since background calculation based on the second method is completed in the step obtaining images, difference of read-out noise between images is eliminated.

(3) The present invention can be applied to real time observation, and element distribution images can be obtained as time passes. Therefore, element distribution can be confirmed even if the element distribution is continuously being varied over time or being drifted.

(4) Since the position and the width of the energy window can be set while an element distribution image is being observed, it is easy to set the optimum condition.

What is claimed is:

1. An element distribution observing method for obtaining an element distribution image of a specified element comprising:

performing an inter-image subtraction between an image of an energy region including core-loss electrons and an image of an energy region not including the core-loss electrons using a transmission electron microscope having an energy filter, and setting an exposure time for said image of the energy region not including the core-loss electrons to a value shorter than an exposure time for said image of the energy region including the core-loss electrons.

2. An element distribution observing method according to claim 1, comprising setting a ratio of the exposure time for said image of the energy region not including the core-loss electrons to the exposure time for said image of the energy region including the core-loss electrons is approximately equal to the reciprocal of an intensity ratio of an intensity of said image of the energy region not including the core-loss electrons to an intensity of said image of the energy region including the core-loss electrons.

3. An element distribution observing method according to claim 1, comprising setting the exposure time for said image of the energy region including the core-loss electrons is approximately equal to a value of multiplying the exposure time for said image of the energy region not including the core-loss electrons by a ratio of the intensity of said image of the energy region not including the core-loss electrons to an intensity of an image of an energy loss region lower than the energy region not including the core-loss electrons.

4. A transmission electron microscope comprising an electron gun; an irradiation electron optical system for irradiating an electron beam emitted from said electron gun; an image forming optical system for image-forming the electron beam transmitted through a sample; an energy filter for separating the electron beam after being transmitted through said sample into an energy spectrum; a means for selecting an electron beam having a specified energy among the energy spectrum of the electron beam; a camera means for picture-taking an image by the energy-selected electron beam; and an exposure control means for controlling exposure time of the camera means, wherein said exposure means sets an exposure time for an image of an energy region not including core-loss electrons to a value shorter than an exposure time for an image of an energy region including the core-loss electrons.

5. A transmission electron microscope comprising an electron gun; an irradiation electron optical system for irradiating an electron beam emitted from said electron gun; an image forming optical system for image-forming the electron beam transmitted through a sample; an energy filter for separating the electron beam after being transmitted through said sample into an energy spectrum; a means for selecting an electron beam having a specified energy among the energy spectrum of the electron beam, a camera means for picture-taking an image by the energy-selected electron beam; and an exposure control means for controlling exposure time of the camera means, which further comprises:

a plurality of memory areas for storing energy selected images taken by said camera means; a memory area selecting means for periodically selecting said plurality of memory areas and storing images taken by said camera means into the selected memory areas; an acceleration voltage changing means for changing an acceleration voltage of the electron beam in synchronism with selection of memory areas by said memory area selecting means; an exposure time changing means for changing an exposure time of said camera means in synchronism with selection of memory areas by said memory area selecting means; and an output means for comparatively calculating the images stored in said plurality of memory areas by every corresponding pixel and outputting the differences of image intensities as an image signal.

6. A transmission electron microscope according to claim 5, wherein the image signal output from said output means corresponds to a two-dimensional distribution image of a specified element from which the background is removed.

7. A transmission electron microscope according to claim 5, wherein the images stored in said plurality of memory areas are images of an energy region not including core-loss electrons and images of an energy region including the core-loss electrons; and said exposure time changing means sets a ratio of the exposure time for said image of the energy region not including the core-loss electrons to the exposure time for said image of the energy region including the core-loss electrons approximately equal to the reciprocal of an intensity ratio of an intensity of said image of the energy region not including the core-loss electrons to an intensity of said image of the energy region including the core-loss electrons.

8. A transmission electron microscope according to claim 5, wherein the images stored in said plurality of memory areas are images of an energy region not including core-loss electrons and images of an energy region including the core-loss electrons; and said exposure time changing means sets the exposure time for said image of the energy region including the core-loss electrons approximately equal to a value of multiplying the exposure time for said image of the energy region not including the core-loss electrons by a ratio of the intensity of said image of the energy region not including the core-loss electrons to an intensity of an image of an energy loss region lower than the energy region not including the core-loss electrons.

* * * * *